United States Patent

Suzuki et al.

[11] Patent Number: 4,791,004
[45] Date of Patent: Dec. 13, 1988

[54] PROCESS FOR FORMING MULTILAYERED COATING FILM

[75] Inventors: Fumiyuki Suzuki; Yoshiaki Tamura; Keisuke Shiba, all of Shizuoka, Japan

[73] Assignee: Fuji Photo Film Co., Ltd., Kanagawa, Japan

[21] Appl. No.: 52,829

[22] Filed: May 22, 1987

[30] Foreign Application Priority Data

May 22, 1986 [JP] Japan ................. 61-116044

[51] Int. Cl.⁴ .................. B05D 3/06; B05D 3/02
[52] U.S. Cl. ............................ 427/54.1; 427/42; 427/55; 427/420; 118/600; 118/DIG. 4; 156/244.23
[58] Field of Search .............. 427/420, 42, 54.1, 55; 118/600, DIG. 4; 156/244.23-244.24, 246, 497, 499

[56] References Cited

U.S. PATENT DOCUMENTS

| | | | |
|---|---|---|---|
| 3,132,966 | 5/1964 | Hughes et al. | 427/42 |
| 3,562,125 | 2/1971 | Van Gasse | 427/42 |
| 3,578,527 | 5/1971 | Sakata et al. | 427/420 |
| 4,113,903 | 9/1978 | Choinski | 427/420 |
| 4,128,667 | 12/1978 | Timson | 118/DIG. 4 |
| 4,548,837 | 10/1985 | Yoshino et al. | 427/420 X |
| 4,571,361 | 2/1986 | Kawaguchi et al. | 428/328 |
| 4,676,190 | 6/1987 | Spengler | 118/DIG. 4 |

FOREIGN PATENT DOCUMENTS

| | | | |
|---|---|---|---|
| 1202421 | 1/1960 | France | 427/420 |
| 53-21904 | 2/1978 | Japan | 427/420 |
| 478624 | 7/1975 | U.S.S.R. | 118/DIG. 4 |

*Primary Examiner*—Shrive Beck
*Attorney, Agent, or Firm*—Sughrue, Mion, Zinn, Macpeak, and Seas

[57] ABSTRACT

A process for forming a multilayered coating film is disclosed, comprising forming a liquid film of a coating composition, increasing the viscosity of the liquid film, and laminating the liquid film having an increased viscosity onto a support or onto a coating film on a support. A multilayered coating film can thereby be formed easily and efficiently without involving interlaminar mixing between adjacent layers.

2 Claims, 1 Drawing Sheet

Fig.
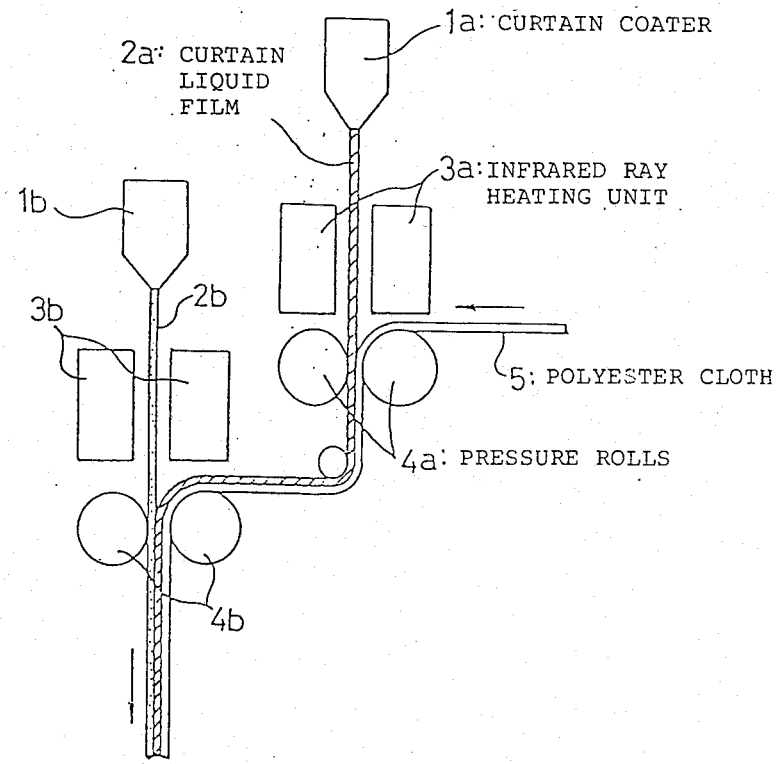

PROCESS FOR FORMING MULTILAYERED COATING FILM

FIELD OF THE INVENTION

This invention relates to a process for forming a multilayered coating film for use, for example, in photosensitive recording materials having a photosensitive coating film, in printing plates such as lithographic presensitized plates, and in screen printing plates, magnetic recording materials, and the like.

BACKGROUND OF THE INVENTION

Formation of a multilayered coating film by applying a coating composition having uniformly dissolved or dispersed therein a part or all of main components onto a support has been conventionally achieved by a successive coating technique in which each layer is separately coated and dried to build up multiple layers, or by an advanced technique called successive multilayer coating (or a so-called wet on wet coating) or simultaneous multilayer coating which comprises forming a plurality of layers through one coating step, followed by drying all at once. For example, Japanese Patent Application (OPI) No. 189969/84 (the term "OPI" as used herein means "unexamined published Japanese patent application") discloses formation of a non-aqueous multilayered coating film.

However, according to the successive coating process, a coating composition applied on a dried coating film re-dissolves or swells a part of the dried coating film to cause interlaminar mixing, resulting in failure to fully attaining the desired performance. In order to avoid interlaminar mixing, an intermediate layer should be provided, which leads to increased costs for both materials and production. Particularly, this technique increases costs due to repetition of coating and drying steps.

Also, successive multilayer coating and simultaneous multilayer coating processes require delicate adjustment of mutual solubility between solvents and solutes of adjacent layers and relationships of adjacent layers in physical properties of the coating compositions. If good adjustments cannot be made, interlaminar mixing will occur before each layer is fixed, thus failing to obtain the expected performance. Hence, much study and effort have been required for putting these technique to practical use.

SUMMARY OF THE INVENTION

Accordingly, one object of this invention is to provide an efficient and simple process for forming a multi-layered coating film which does not involve substantial interlaminar mixing.

The coating process according to the present invention comprises making a coating composition flow from a container to form a liquid film, increasing the viscosity of the liquid film, and laminating said liquid film having an increased viscosity onto a support or onto coating film formed on a support.

In a preferred embodiment of the present invention, the multilayered coating film thus formed is subjected to finishing for fixing.

BRIEF DESCRIPTION OF THE DRAWING

The drawing is a flow chart showing an example of the process according to the present invention. In the drawing, the numerical symbols 1a and 1b depict curtain coaters; 2a and 2b depict liquid films (curtains); 3a and 3b depict infared ray heating units; 4a and 4b depict pressure rolls; and 5 depicts a polyester cloth.

DETAILED DESCRIPTION OF THE INVENTION

The container from which a coating composition is made to flow to form a liquid film includes a hopper having an open top, a closed extruder or slot die, etc. The coating composition is discharged from a slot orifice of such containers to form a liquid film like a curtain in a so-called curtain coating technique.

The viscosity of the coating composition is increased while it is in the form of a liquid film. This can be carried out by a method in which a solvent in the liquid film is evaporated by heating with warm air, induction heating, infrared heating, and the like to concentrate the liquid, and decreasing the temperature, to steeply increase the viscosity; a method comprising inducing a polymerization reaction by application of electron rays, ultraviolet rays or heat to cause a steep rise of viscosity through molecular weight increase of a prepolymer; a method comprising cooling the liquid film to cause gelation, and the like. The method to be applied can be selected appropriately depending on the kind of the coating composition. The viscosity of the coating composition is increased until the composition has a diffusion constant of $10^{-9}$ cm$^2$/sec or less, preferably $10^{-10}$ cm$^2$/sec, and, at this point, the composition has a viscosity of at least about $10^4$ cp, preferably about $10^5$ cp.

The support which can be used in the present invention is a flexible web including paper, plastics, nonwoven fabrics, plastic cloths or screens and surface-finished products of these supports.

The terminology "multilayered coating film" as used herein means a coating film composed of at least two layers.

The liquid film having an increased viscosity is then laminated on a support or a coating film formed on the support by a known laminating process. For example, a support or a support having provided thereon a coating film and the liquid film are passed through a pair of Teflon-coated pressure rolls.

Lamination of multilayer coating films can be effected according to various embodiments. For example, (1) each layer is built up by individual lamination; (2) a liuqid film composed of a plurality of liquid layers is formed beforehand and laminated on a support; (3) a coating composition for an undermost layer is first coated on a support, and a liquid film is then laminated thereon; or (4) a plurality of coating films are formed on a support, and a liquid film is then laminated thereon.

In a preferred embodiment of the present invention, the multilayered coating film thus formed is subjected to finishing for fixing, i.e., hardening of the coating film to a degree suitable for practical use.

The finishing treatment for fixing the multilayered coating film varies depending on the coating composition. For example, the coating film may be heated with warm air or by induction heating or infrared heating to evaporate the solvent, or may be treated with electron radiation, ultraviolet radiation or heat to cause further polymerization of a prepolymer. The fixing may also be effected by merely cooling the coating film. In carrying out the finishing, cares should be taken so that any rise in temperature that occurs does not cause interlaminar mixing due to reduction of the viscosity of the coating film immediately after formation from the liquid film.

According to the present invention, since the viscosity of the liquid film in a liquid state is increased, the liquid film can be laminated onto a support or onto a coating film on a support by a known laminating technique. Mixing of two adjacent layers does not occur due to the increased viscosity of the liquid film.

The present invention is now illustrated in greater detail by way of the following examples, but it should be understood that the present invention is not limited thereto. In these examples, all the parts and percents are by weight unless otherwise indicated.

EXAMPLE 1

An example of application of the present invention to a screen printing plate is described below with reference to the drawing.

Two parts of a diazo resin (a condensate between diphenylamine and p-formaldehyde) were dissolved in 50 parts of a 20% aqueous solution of polyvinyl alcohol (degree of saponification: 80%; degree of polymerization: 500) and 20 parts of a polyvinyl acetate emulsion having a solid content of 50% to prepare Light-Sensitive Composition (A).

Light-Sensitive Composition (B) was prepared in the same manner as described above except for changing the amount of the diazo resin to 1.2 parts.

The drawing is a flow chart illustrating one embodiment of the process according to the present invention. In the drawing, Light-Sensitive Composition (A) was made to flow from curtain coater 1a to form curtain liquid film 2a. The curtain film in the liquid state was heated by infrared heating unit 3a to evaporate the solvent, i.e., water, to increase the viscosity to about 15,000 cp. The curtain film was then laminated on a polyester cloth 5 of 250 mesh (Tylar standard) by passing through Teflon-coated pressure rolls 4a to form a coating film having a thickness of 10 μm.

Light-Sensitive Composition (B) was then made to flow from curtain coater 1b to form curtain liquid film 2b. The solvent of the curtain film, i.e., water, was evaporated by heating with infrared heating unit 3b to increase the viscosity. The curtain film was laminated onto the coating film comprising Light-Sensitive Composition (A) on the polyester cloth by passing through Teflon-coated pressure rolls 4b to form a coating film having a thickness of 15 μm.

The multilayered coating film built up on the polyester cloth was passed through a dryer at 80° C. for fixing, i.e., final drying.

The resulting coated screen was adhered to an aluminum-surfaced plate and cut in an appropriate size to obtain a screen printing plate precursor. No substantial interlaminar mixing between (A) and (B) layers was observed.

The screen printing plate precursor was brought into intimate contact with a positive pattern, exposed to light through the pattern using a 1 kW mercury lamp, developed with water spouted from a shower head, and dried. As a result, a sharp image having a resolving power of about 80 μm was formed on the screen. When screen printing was carried out using the resulting screen printing plate, no problem was encountered even after 5,000 prints.

EXAMPLE 2

In this example, the same apparatus as in Example 1 was used, except for using an electron ray radiator in place of the infrared heating unit.

Light-Sensitive Composition (C) was prepared from 21 parts of a cresol resin, 4 parts of an electron-curable polyacrylate, 40 parts of cellosolve acetate, and 10 parts of methyl ethyl ketone. Light-Sensitive Composition (D) was prepared in the same manner as for Composition (C), except for additionally containing 1 part of a blue dye.

Light-Sensitive Composition (C) was made to flow to form a curtain liquid film in the same manner as in Example 1, and the curtain film in a liquid state was irradiated with electron rays to gel. The liquid film having thus increased viscosity was laminated onto a polyester base of 80 μm in thickness by passing through pressure rolls.

A curtain liquid film of Light-Sensitive Composition (D) was formed and irradiated with electron rays to have an increased viscosity. The film was then laminated onto the coating film comprising Composition (C) by passing through pressure rolles to form a coating film having a thickness of 22 μm.

The multilayered coating film thus formed was dried in a drier at 100° C. to remove the excess of the solvent.

The cross-section of the multilayered coating film on the polyester base was observed under a microscope of 250 magnifications. As a result, the coating film made of Composition (C) containing no dye and the coating film made of Composition (D) containing a blue dye were clearly distinguishable with no substantial mixing with each other.

As described above, the present invention makes it possible to easily and efficiently form a multilayered coating film without being accompanied by substantial mixing of adjacent layers. The effect of the process of the invention can be further enhanced by subjecting the resulting multilayered coating film to finishing for coating film fixing. Therefore, the present invention makes a great contribution to the production of multilayer coating film.

While the invention has been described in greater detail and with reference to specific embodiments thereof, it will be apparent to one skilled in the art that various changes and modifications can be made therein without departing from the spirit and scope thereof.

What is claimed is:

1. A process for forming a multilayered coating film which comprises making a coating composition flow from a container to form a liquid film, increasing the viscosity of the liquid film to a diffusion constant of $10^{-9}$ cm$^2$/sec or less and a viscosity of at least about $10^4$ cp by evaporation fo a solvent by heating with warm air, induction heating, or infrared heating, and laminating the liquid film having an increased viscosity onto a support or on a coating film formed on a support.

2. A process for forming a multilayered coating film which comprises making a coating composition flow from a container to form a liquid film, increasing the viscosity of the liquid film to a diffusion constant of $10^{-9}$ cm$^2$/sec or less and a viscosity of at least about $10^4$ cp by gelation of the coating composition, and laminating the liquid film having an increased viscosity onto a support or on a coating film formed on a support.

* * * * *